United States Patent
Kenney

(10) Patent No.: US 12,265,376 B2
(45) Date of Patent: Apr. 1, 2025

(54) PROGRAMMABLE DELAY LINE WITH GLITCH SUPPRESSION

(71) Applicant: Analog Devices, Inc., Wilmington, MA (US)

(72) Inventor: John Kenney, West Windsor, NJ (US)

(73) Assignee: Analog Devices, Inc., Wilmington, MA (US)

(*) Notice: Subject to any disclaimer, the term of this patent is extended or adjusted under 35 U.S.C. 154(b) by 249 days.

(21) Appl. No.: 18/055,088

(22) Filed: Nov. 14, 2022

(65) Prior Publication Data

US 2023/0070085 A1 Mar. 9, 2023

Related U.S. Application Data

(62) Division of application No. 17/093,311, filed on Nov. 9, 2020, now Pat. No. 11,526,153.

(51) Int. Cl.
*H03K 5/15* (2006.01)
*G05B 19/4155* (2006.01)
(Continued)

(52) U.S. Cl.
CPC ......... *G05B 19/4155* (2013.01); *H03K 3/037* (2013.01); *G05B 2219/34043* (2013.01); *H03K 5/00* (2013.01); *H03K 2005/00058* (2013.01)

(58) Field of Classification Search
CPC ...... G05B 19/4155; G05B 2219/34043; H03K 3/037; H03K 3/37; H03K 2005/00058; H03K 2005/00019; H03K 2005/00032; H03K 2005/00045; H03K 2005/00071; H03K 5/15; H03K 5/1502
(Continued)

(56) References Cited

U.S. PATENT DOCUMENTS 6,348,827 B1 2/2002 Fifield et al.
7,619,457 B1 * 11/2009 Mai .................. H03K 5/133
327/264
(Continued)

FOREIGN PATENT DOCUMENTS

DE 202021105947 1/2022

OTHER PUBLICATIONS

U.S. Appl. No. 17/093,311 U.S. Pat. No. 11,526,153, filed Nov. 9, 2020, Programmable Delay Line With Glitch Suppression.
(Continued)

*Primary Examiner* — Hai L Nguyen
(74) *Attorney, Agent, or Firm* — Schwegman Lundberg & Woessner, P.A.

(57) ABSTRACT

There is disclosed herein programmable delay lines and control methods having glitch suppression. In particular, the programmable delay lines may include latches that are triggered based on a trigger event of an input signal (which is often an edge of the input signal). The programmable delay lines may include one or more latches coupled between capacitor and transistor subassemblies and the latches, where the latches cause a delay between the time the trigger event arrives at the capacitor and transistor subassemblies and the latches. The delay can prevent the latches from updating at the same time that the edge of the input signal arrives at the capacitor and transistor subassemblies, which can suppress glitches that can causes errors in operation.

9 Claims, 7 Drawing Sheets

(51) Int. Cl.
  *H03K 3/037*   (2006.01)
  *H03K 5/00*    (2006.01)

(58) Field of Classification Search
  USPC .................................. 327/182, 183, 199
  See application file for complete search history.

(56) References Cited

U.S. PATENT DOCUMENTS

| | | |
|---|---|---|
| 7,932,848 B2 | 4/2011 | Watanabe |
| 10,666,241 B2 | 5/2020 | Kuramochi et al. |
| 11,526,153 B2 | 12/2022 | Kenney |
| 2022/0147017 A1 | 5/2022 | Kenney |

OTHER PUBLICATIONS

"U.S. Appl. No. 17/093,311, Restriction Requirement mailed Nov. 3, 2021", 7 pgs.
"U.S. Appl. No. 17/093,311, Response filed Dec. 28, 2021 to Restriction Requirement mailed Nov. 3, 2021", 4 pgs.
"U.S. Appl. No. 17/093,311, Non Final Office Action mailed Apr. 29, 2022", 5 pgs.
"U.S. Appl. No. 17/093,311, Response filed Jul. 28, 2022 to Non Final Office Action mailed Apr. 29, 2022", 7 pgs.
"U.S. Appl. No. 17/093,311, Notice of Allowance mailed Jan. 18, 2022", 8 pgs.
"U.S. Appl. No. 17/093,311, 312 Amendment filed Apr. 16, 2022", 7 pgs.
"U.S. Appl. No. 17/093,311, Notice of Allowance mailed Aug. 16, 2022", 8 pgs.
Ma, "A 9.8 Gbps, 6.5 mW Forwarded-clock Receiver with Phase Interpolator and Equalized Current Sampler in 65 nm CMOS", IEEE MTT-S International Microwave Symposium, (2015), 4 pgs.

\* cited by examiner

PROGRAMMABLE DELAY LINE WITH GLITCH SUPPRESSION

CROSS-REFERENCE TO RELATED APPLICATIONS

This Application is a divisional (and claims benefit of priority under 35 U.S.C. § 121 of U.S. application Ser. No. 17/093,311 filed Nov. 9, 2020, now U.S. Pat. No. 11,526,153 issued on Dec. 13, 2022 entitled "PROGRAMMABLE DELAY LINE WITH GLITCH SUPPRESSION," the disclosure of which is considered part of (and is incorporated by reference in) the disclosure of this application.

FIELD OF THE DISCLOSURE

This disclosure relates in general to the field of circuit design, and more particularly, though not exclusively, to systems and methods for implementing programmable delay lines within a circuit.

BACKGROUND

Delay lines have been implemented in many circuits, including time-interleaved quantizers. In particular, delay lines may be utilized for shifting the phase of signals on the delay line. In some instances, the delay lines may be utilized for synchronization of signals, and/or setting phase differences between signals within a circuit. Programmable delay lines have been implemented in circuits, although glitches can occur as the amount of delay is adjusted.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

SUMMARY OF THE DISCLOSURE

Figure 1:
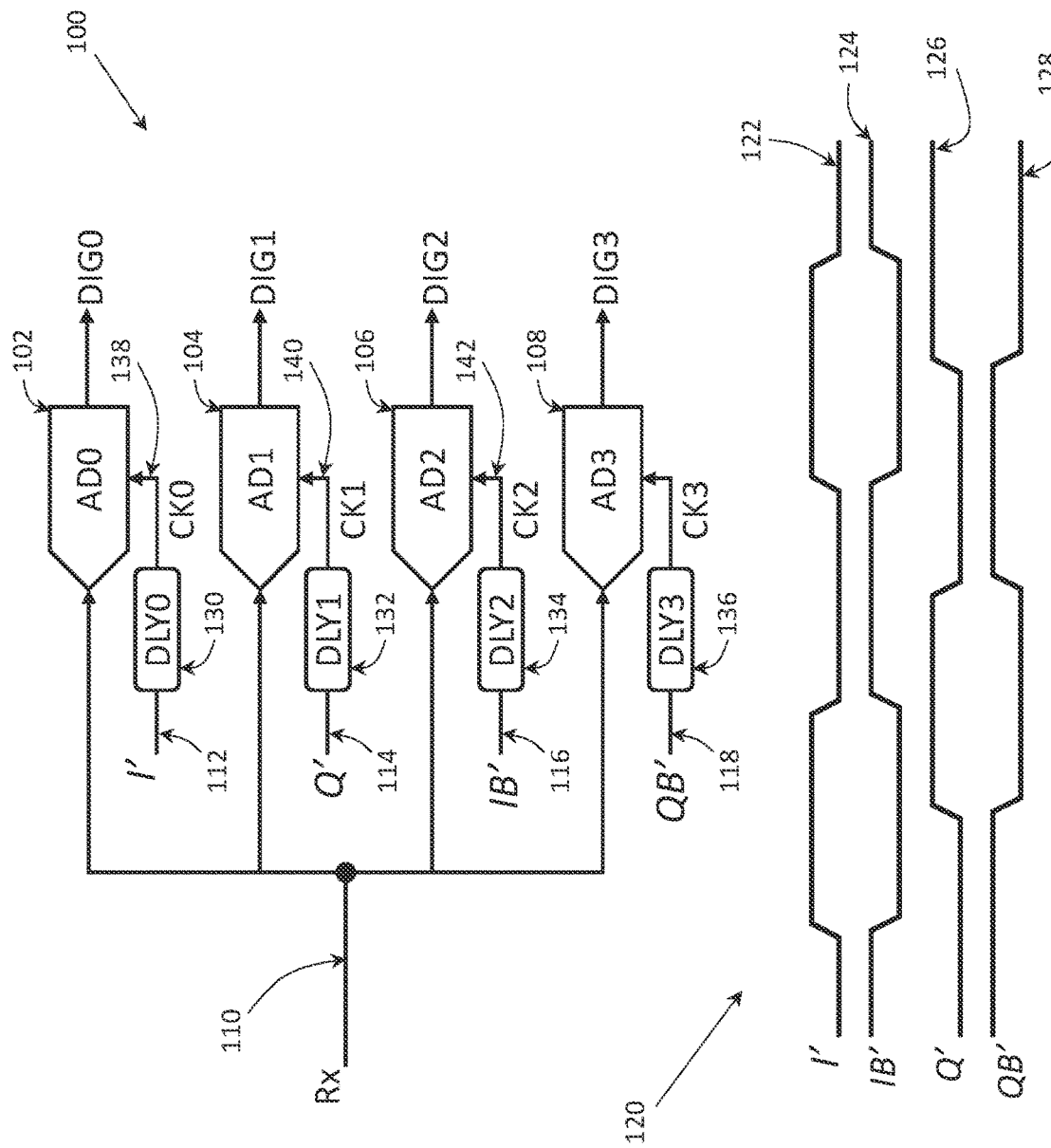
FIG. 1 illustrates an example time-interleaved quantizer, according to various embodiments of the disclosure.

There is disclosed herein programmable delay lines and control methods having glitch suppression. In particular, the programmable delay lines may include latches that are triggered based on a trigger event of an input signal (which is often an edge of the input signal). The programmable delay lines may include one or more latches coupled between capacitor and transistor subassemblies and the latches, where the latches cause a delay between the time the trigger event arrives at the capacitor and transistor subassemblies and the latches. The delay can prevent the latches from updating at the same time that the edge of the input signal arrives at the capacitor and transistor subassemblies, which can suppress glitches that can cause errors in operation.

Some embodiments herein may comprise a delay circuit. The delay circuit may include a capacitor and transistor subassembly coupled to an input of the delay circuit. The delay circuit may further include a first buffer coupled between the capacitor and transistor subassembly and an output of the delay circuit and a second buffer coupled to the output of the delay circuit. The delay circuit may include a latch coupled to the capacitor and transistor subassembly, wherein the latch is to receive an output of the second buffer as a trigger for the latch, wherein the latch is to control conduction of the capacitor and transistor subassembly, and wherein the capacitor and transistor subassembly is to apply a delay to a signal applied to the input of the delay circuit when the capacitor and transistor subassembly is conducting.

Some embodiments herein may comprise a delay system. The delay system may include a static phase offset (SPO) delay element to receive an input signal, the SPO delay element may include a capacitor and transistor subassembly coupled an input of the SPO delay element, the capacitor and transistor subassembly to apply a delay to the input signal when the capacitor and transistor subassembly is conducting. The SPO delay element may further include a buffer coupled to an output of the SPO delay element, and a latch coupled to the buffer and to receive an output of the buffer as a trigger input, wherein an output of the latch is to control conduction of the capacitor and transistor subassembly. The delay system may further include a shift register coupled to the SPO delay element, the shift register to provide a control word to the SPO delay element, wherein the control word defines a value of the output of the latch.

Some embodiments herein may comprise a method for controlling a delay system for a signal. The method may include providing a first control word to a first SPO delay element, and providing a second control word to a second SPO delay element, wherein the second control word is within a single bit difference of the first control word. The method may further include updating a value of the first control word based on a strobe signal and a shift signal, wherein updating of the value of the first control word is maintain the second control word within the single bit difference of the first control word.

Some embodiments herein may comprise a shift register of a delay system. The shift register may include a first circuit to determine, based on a least significant bit (LSB) and a shift signal, whether to update a value of the control word, and a second circuit to update a value of the LSB.

DETAILED DESCRIPTION

Many circuits can benefit from the implementation of programmable delay lines. For example, time-interleaved quantizers, among other circuits, can benefit from implementation of programmable delay lines for compensating for random offsets that may occur within the time-interleaved quantizers. It can also be beneficial to the time-interleaved quantizers to have the ability to change the delay time of the programmable delay lines as data traffic is being processed by the circuit. Changing the delay time as data traffic is being processed is not trivial, because glitches can occur if the change in delay time happens during a critical sampling edge of a clock transition. The programmable delay lines and approaches described herein may avoid the change of the delay time during the critical sampling edge of the clock transition, thereby avoiding glitches within the operation of the circuit.

FIG. 1 illustrates an example time-interleaved quantizer 100, according to various embodiments of the disclosure. In the illustrated embodiment, the time-interleaved quantizer 100 includes four analog-to-digital converters (ADCs), although it should be understood that time-interleaved quantizers can have more or less ADCs in other instances. In particular, the time-interleaved quantizer 100 includes a first ADC 102, a second ADC 104, a third ADC 106, and a fourth ADC 108 in the illustrated embodiment. Each of the ADCs may be coupled to a receiver node 110 and may receive an analog signal from the receiver node 110 to be converted to a digital signal.

Each of ADCs may receive a corresponding clock signal that causes the ADCs to sample the analog signal received from the receiver node 110 for conversion to a digital value. The clock signals may be generated by clock circuitry. For example, the clock circuitry may generate a first clock signal 112 (labeled I') for the first ADC 102, a second clock signal 114 (labeled Q') for the second ADC 104, a third clock signal 116 (labeled IB') for the third ADC 106, and a fourth clock signal 118 (labeled QB') for the fourth ADC 108 in the illustrated embodiment. A timing chart 120 illustrates some examples of the clock signals. In particular, a first signal line 122 shows an example of the first clock signal 112, a second signal line 124 shows an example of the second clock signal 114, a third signal line 126 shows an example of the third clock signal 116, and a fourth signal line 128 shows an example of the fourth clock signal 118.

In some instances, the clock signals generated by the clock circuitry may be offset in phase from desired trigger timings. For example, a clock edges of first clock signal 112, the second clock signal 114, the third clock signal 116, and the fourth clock signal 118 may be offset from desired trigger times that the corresponding ADCs are intended to be triggered. The offsets may be due to one or more factors, such as characteristics of the clock circuitry that generates the clock signals. The offsets of the clock signals from the desired trigger timing may cause issues with the operation of the time-interleaved quantizer 100.

The time-interleaved quantizer 100 may include one or more delay lines. For example, the time-interleaved quantizer 100 may include a delay line for each of the clock signals generated by the clock circuitry. The illustrated embodiment includes a first delay line 130 corresponding to the first clock signal 112, a second delay line 132 corresponding to the second clock signal 114, a third delay line 134 corresponding to the third clock signal 116, and the fourth delay line 136 corresponding to the fourth clock signal 118. The delay lines may comprise programmable delay lines that can provide glitch suppression as described throughout this disclosure. The delay lines may apply respective time delays to the clock signals to shift the phase of the signals. For example, the delay lines may be programmed to apply time delays to the clock signals as needed or desired to set the clock signals in phase with the desired trigger times or reduce offsets from the desired trigger times.

The delay lines may produce compensated clock signals, where the compensated clock signals may be generated through application of a time delay to the clock signals and/or passing of the clock signals through the delay line without delay as desired. In the illustrated embodiment, the first delay line 130 produces a first compensated clock signal 138, the second delay line 132 produces a second compensated clock signal 140, the third delay line 134 produces a third compensated clock signal 142, and the fourth delay line 136 produces a fourth compensated clock signal 144. The first compensated clock signal 138 may be provided to the first ADC 102, the second compensated clock signal 140 may be provided to the second ADC 104, the third compensated clock signal 142 may be provided to the third ADC 106, and the fourth compensated clock signal 144 may be provided to the fourth ADC 108 to trigger the ADCs.

For example, the first ADC 102 receives a first clock signal 112, the second ADC 104 receives a second clock signal 114, the third ADC 106 receives a third clock signal 116, and the fourth ADC 108 receives a fourth clock signal 118 in the illustrated embodiment. The clock signals may cause or trigger the corresponding ADC to sample the analog signal from the receiver node 110 and perform the conversion of the analog sample to a digital value.

Figure 2:
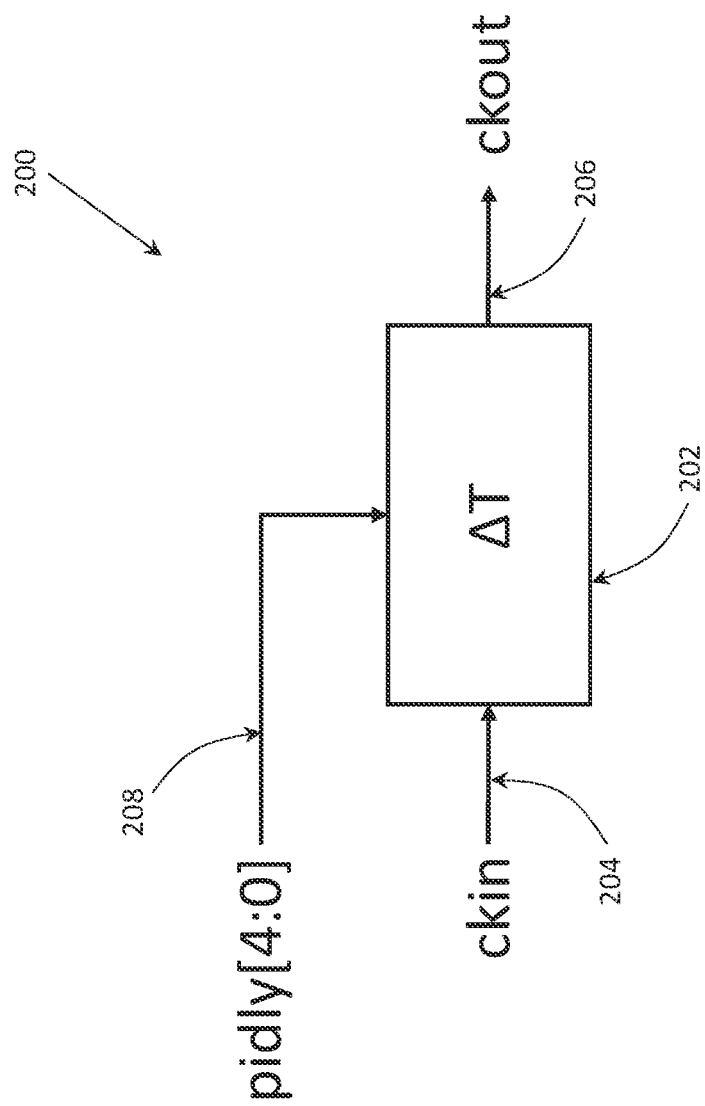
FIG. 2 illustrates an example delay system, according to various embodiments of the disclosure.

FIG. 2 illustrates an example delay system 200, according to various embodiments of the disclosure. The delay system 200 may be implemented in the delay lines of the time-interleaved quantizer 100 (FIG. 1). In particular, each of the delay lines within the time-interleaved quantizer 100 may comprise a delay system, where the delay system includes the features of the delay system 200.

The delay system 200 may include a programmable delay line 202. The programmable delay line 202 may receive an input signal 204 (labeled ckin). In the illustrated embodiment, the input signal 204 comprises a clock signal. The programmable delay line 202 may apply a delay to the input signal 204 to shift the phase of the input signal 204 in some instances. The programmable delay line 202 may output a compensated output signal 206 (labeled ckout), the compensated output signal 206 being the result of the delay being applied to the input signal 204. In the illustrated embodiment, the compensated output signal 206 comprises a clock output signal. Referring back to FIG. 1, the clock output signal can trigger a corresponding one of the ADCs to sample the analog signal.

The programmable delay line 202 may receive a control word 208 (labeled pidly[4:0]) that defines an amount of delay to be applied by the programmable delay line 202. The control word 208 comprises a 5-bit word in the illustrated embodiment. While the control word 208 shown in the illustrated embodiment is a 5-bit word, it should be understood that the control word 208 may having fewer or more bits in other embodiments. The control word 208 can define whether delay is to be applied to the input signal 204 by the programmable delay line 202 and/or an amount of delay to be applied to the input signal 204 by the programmable delay line 202. The control word 208 may select from a plurality of delay times stored by the programmable delay line 202, where the programmable delay line 202 may apply the amount of delay selected by the control word 208. The results of applying the amount of delay, or lack thereof, to the input signal 204 may produce the compensated output signal 206.

Figure 3:
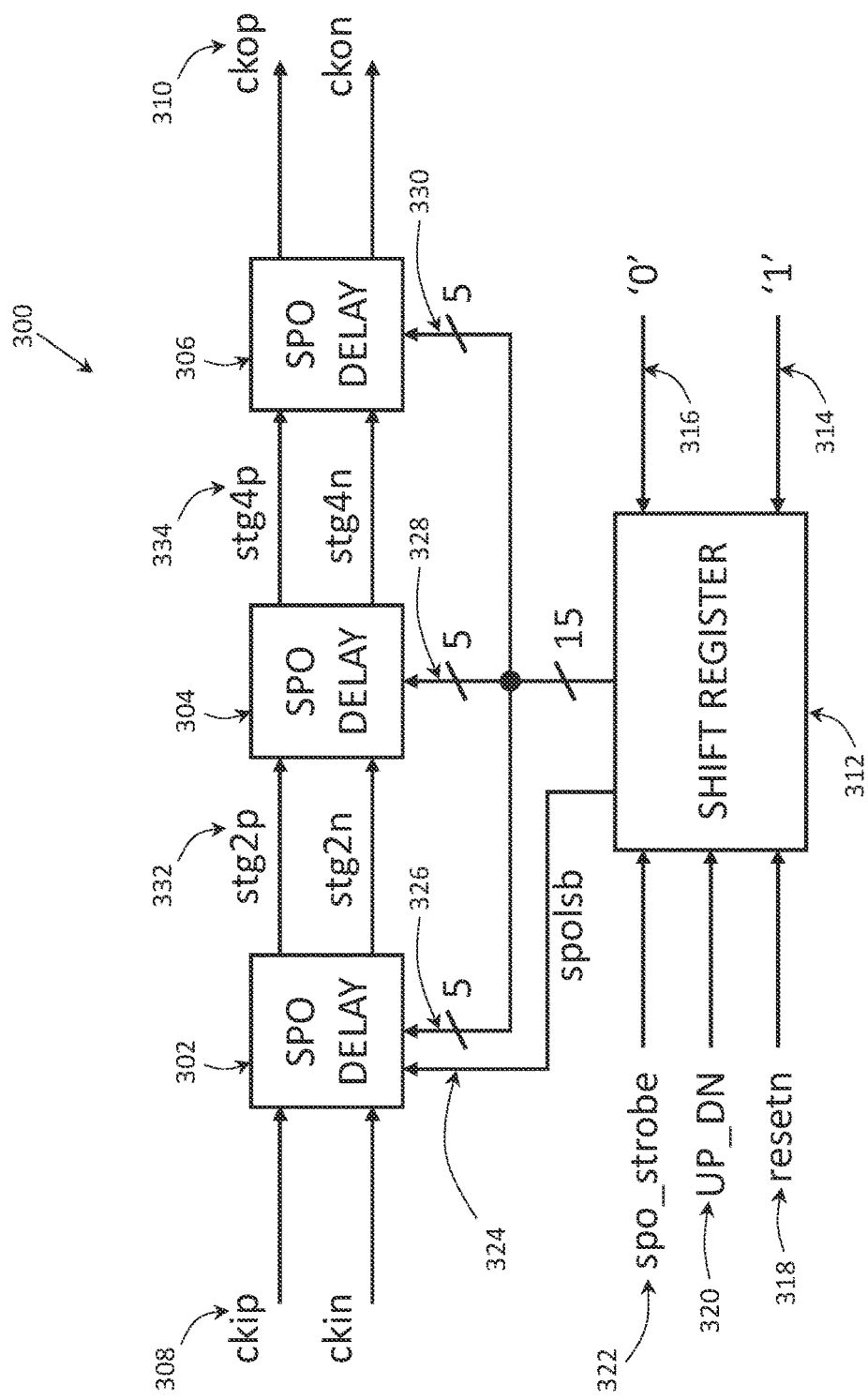
FIG. 3 illustrates another example delay system, according to various embodiments of the disclosure.

FIG. 3 illustrates another example delay system 300, according to various embodiments of the disclosure. The delay system 300 may be implemented in the delay lines of the time-interleaved quantizer 100 (FIG. 1). In particular, each of the delay lines within the time-interleaved quantizer 100 may comprise a delay system, where the delay system includes the features of the delay system 300.

The delay system 300 may comprise a differential programmable delay line system. The delay system 300 may comprise a delay line having one or more SPO delay elements, in cascade or in series. For example, the delay system 300 includes a first SPO delay element 302, a second SPO delay element 304, and a third SPO delay element 306 that form a delay line in the illustrated embodiment. An output of the first SPO delay element 302 may be coupled to an input of the second SPO delay element 304, and an output of the second SPO delay element 304 may be coupled to an input of the third SPO delay element 306. The first SPO delay element 302 may receive a differential input signal 308 and propagate the differential input signal 308 through the second SPO delay element 304 and the third SPO delay element 306 to produce a differential output signal 310, where each of the SPO delay elements may apply a time delay as the differential input signal 308 is propagated through the SPO delay element.

The delay system 300 may further include a shift register 312. The shift register may generate one or more control words and/or a LSB that set the delays corresponding to the SPO delay elements. The shift register 312 may receive bit values that define values for the bits in the control words. In particular, the shift register 312 may receive a high bit value 314 (labeled "1") and a low bit value 316 (labeled "0"), where the high bit value 314 defines a voltage level that is to be used for a high bit in the control words and the low bit value 316 defines a voltage level that is to be used for a low bit in the control words.

The shift register 312 may further receive one or more signals that define the control words to be output by the shift register 312. In the illustrated embodiment, the shift register 312 receives a reset signal 318 (labeled resetn), a shift signal 320 (labeled UP_DN), and a strobe signal 322 (labeled spo_strobe).

The reset signal 318 may indicate that the shift register 312 should reset the control words to a particular state. For example, the reset signal 318 being in a certain state or transitioning to a certain state may indicate that the shift register 312 is to reset to control words to the particular state. In some embodiments, the particular state may include setting the bits of the control words to the low bit value.

The shift signal 320 may indicate a shift to be performed to a current value of the control words and/or an LSB. For example, the shift signal 320 may indicate that the shift register 312 is to transition to an adjacent control word in an ordered group of control words and/or change a value of the LSB that may be output by the shift register 312. The shift signal 320 being high may indicate that the shift register 312 is to transition to the higher adjacent control word in the ordered group of control words and/or that the LSB value is to be changed, and the shift signal 320 being low may indicate that the shift register 312 is to transition to the lower adjacent control word in the ordered group of control words and/or the LSB value is to be changed in some embodiments.

The strobe signal 322 may indicate when the control words and/or the LSB is to be updated by the shift register 312. For example, the strobe signal 322 transitioning to a certain state may indicate that the control words and/or the LSB is to be updated by the shift register 312. Accordingly, the shift register 312 may consider the values of the shift signal 320 and/or the reset signal 318 at the transition to the certain state of the strobe signal 322, and update the control words and/or the LSB based on the values of the shift signal 320 and/or the reset signal 318 at the transition of the strobe signal 322 in some embodiments. In other embodiments, shift register 312 may update based on the value of the reset signal 318 when the reset signal 318 transitions and update based on the value of the shift signal 320 when the strobe signal 322 transitions.

The shift register 312 may output current values of the one or more control words and/or the LSB to the SPO delay elements. In the illustrated embodiment, the shift register 312 provides a LSB 324 to the first SPO delay element 302, a first control word 326 to the first SPO delay element 302, a second control word 328 to the second SPO delay element 304, and a third control word 330 to the third SPO delay element 306. In the illustrated embodiment, the first control word 326, the second control word 328, and the third control word 330 are each illustrated as being 5-bit words, although it should be understood that the bit lengths of the control words may be different in other embodiments. In some embodiments, the control words may comprise thermometer-encoded control words. In particular, the first control word 326 may be a first thermometer-encoded control word, the second control word 328 may be a second thermometer-encoded control word, and the third control word 330 may be a third thermometer-encoded control word in the embodiments. The control words and/or the LSB may define an amount of delay to be applied to the differential input signal 308 by each of the SPO delay elements. In the illustrated embodiment, the LSB 324 and the first control word 326 defines an amount of delay to be applied by the first SPO delay element 302, the second control word 328 defines an amount of delay to be applied by the second SPO delay element 304, and the third control word 330 defines an amount of delay to be applied by the third SPO delay element 306.

In the illustrated embodiment, the first SPO delay element 302 may receive the differential input signal 308 and apply a delay to the differential input signal 308 corresponding to the LSB 324 and the first control word 326 to produce a first intermediate signal 332. The second SPO delay element 304 may receive the first intermediate signal 332 and apply a delay to the first intermediate signal 332 corresponding to the second control word 328 to produce a second control word 328 to produce a second intermediate signal 334. The third SPO delay element 306 may receive the second intermediate signal 334 and apply a delay to the second intermediate signal 334 corresponding to the third control word 330 to produce the differential output signal 310. The amount of delay applied by the first SPO delay element 302, the second SPO delay element 304, and/or the third SPO delay element 306 may change as the LSB 324, the first control word 326, the second control word 328, and/or the third control word 330 change. Accordingly, the amount of delay applied to the differential input signal 308 by the delay line formed by the first SPO delay element 302, the second SPO delay element 304, and the third SPO delay element 306 to produce the differential output signal 310 may be programmed by the inputs to the shift register 312 that cause the LSB 324, the first control word 326, the second control word 328, and the third control word 330 to be set.

Figure 4:
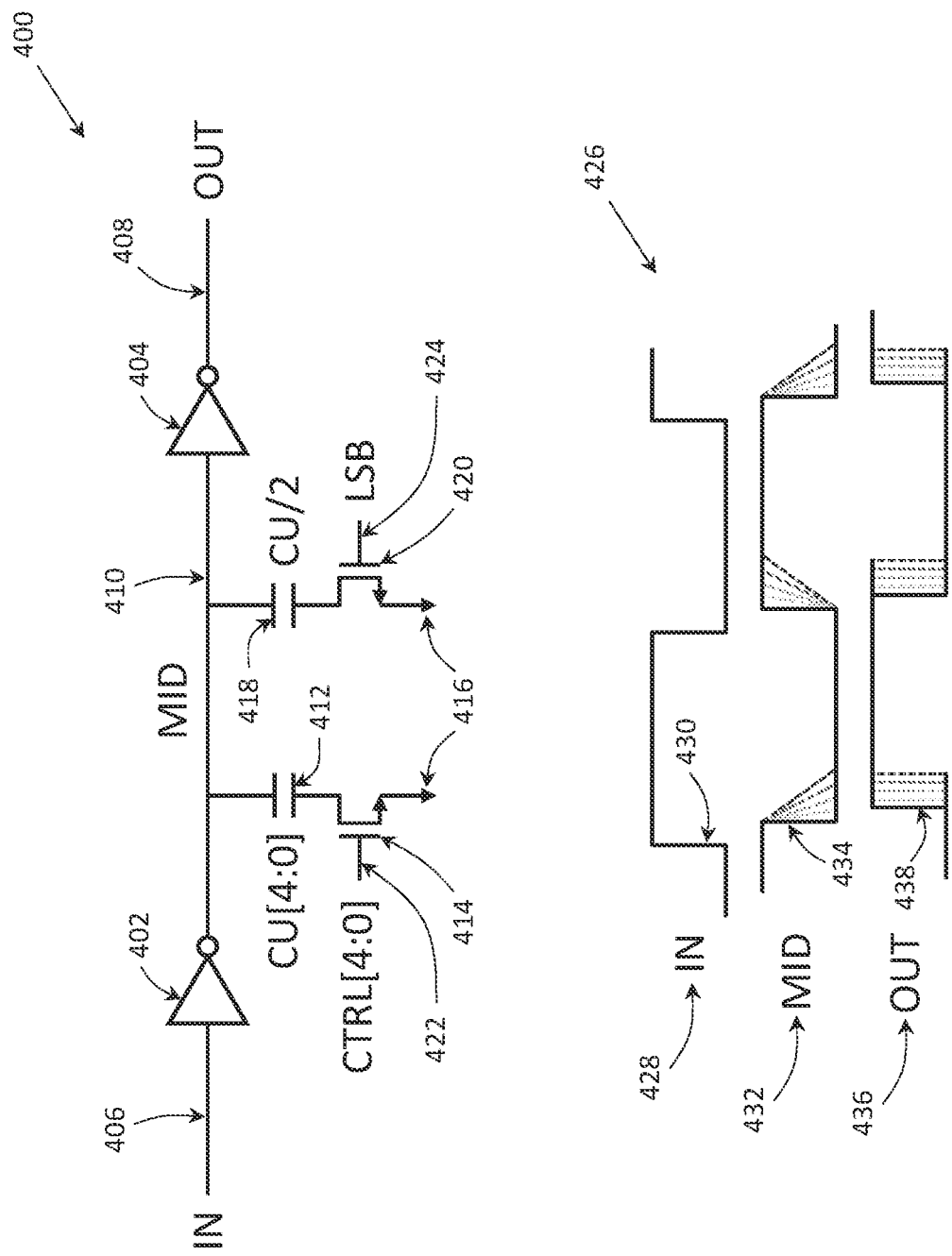
FIG. 4 illustrates an example static phase offset delay unit cell, according to various embodiments of the disclosure.

FIG. 4 illustrates an example SPO delay unit cell 400, according to various embodiments of the disclosure. The programmable delay line 202 (FIG. 2) and/or the SPO delay elements of the delay system 300 (FIG. 3) may include one or more SPO delay unit cells, where each of the SPO delay unit cells may have the features of the SPO delay unit cell 400. The SPO delay unit cell 400 may comprise a single-ended SPO delay unit cell. In embodiments where programmable delay lines and/or the SPO delay elements operate on a differential signal (such as the SPO delay elements of the delay system 300), a SPO delay unit cell may operate on a positive line of the differential signal and another SPO delay unit cell may operation on a negative line of the differential signal.

The SPO delay unit cell 400 may include a first buffer 402 and a second buffer 404. In some embodiments, the first buffer 402 and the second buffer 404 may comprise inverting buffers. The first buffer 402 may be coupled to an input 406 (labeled IN) of the SPO delay unit cell 400 and may receive a signal. The signal received by the first buffer 402 may be an input to an SPO delay element, such as an input of the first SPO delay element 302 (FIG. 3), an input of the second SPO delay element 304 (FIG. 3), and/or an input of the third SPO delay element 306 (FIG. 3). An output of the first buffer 402 may be coupled to an input of the second buffer 404, where a node 410 (labeled MID) may be formed between the first buffer 402 and the second buffer 404. The second buffer 404 may output an output 408 (labeled OUT) of the SPO delay unit cell 400. The output 408 of the SPO delay unit cell 400 may be an output of an SPO delay element, such as an output of the first SPO delay element 302, an output of the second SPO delay element 304, and/or an output of the third SPO delay element 306.

The SPO delay unit cell 400 may include one or more capacitor and transistor subassemblies. A capacitor and transistor subassembly may include one or more capacitors coupled to the node 410 between the first buffer 402 and the second buffer 404 at node 410. The one or more capacitors may be coupled to a corresponding transistor, where the transistor may couple and decouple the capacitors to a negative rail 416 of the SPO delay unit cell 400. The SPO delay unit cell 400 may include a plurality of capacitor and transistor subassemblies, where each capacitor and transistor subassembly may correspond to and is controlled by a corresponding bit of a control word provided to the SPO delay unit cell 400.

For brevity, a single capacitor and transistor subassembly having a capacitor 412 and a transistor 414 that corresponds to a single bit of a control word 422 provided to the SPO delay unit cell 400 is described. Each bit of a control word provided to the SPO delay unit cell 400 may have a corresponding capacitor and transistor subassembly within the SPO delay unit cell 400, where the capacitors and transistors of the transistor subassembly have the features of the capacitor 412 and the transistor 414, respectively. The transistor 414 may be coupled between the capacitor 412 and a negative rail 416 of the SPO delay unit cell 400, which is illustrated as ground in this embodiment. A gate of the transistor 414 may be receive the corresponding bit of the control word 422. The bit of the control word 422 may control conductance of the transistor 414. When the transistor 414 is not conducting, the capacitor 412 may be decoupled from the negative rail 416 and delay may not be applied to a signal (or a minimal delay may be applied due non-ideal characteristics of the components of the SPO delay unit cell 400) applied at the input 406 of the SPO delay unit cell 400 by the capacitor and transistor subassembly. When the transistor 414 is conducting, the capacitor 412 may be coupled to the negative rail and delay may be applied to the signal applied at the input 406 of the SPO delay unit cell 400 by the capacitor and transistor subassembly.

While one capacitor and transistor subassembly has been described, it should be understood that there may be multiple capacitor and transistor subassemblies within the SPO delay unit cell 400. In the illustrated example, the capacitor 412 is labeled CU[4:0] and the control word provided to the SPO delay unit cell 400 is labeled CTRL[4:0]. This is to indicate that the SPO delay unit cell 400 may be configured for a five-bit control word and may have five separate capacitor and transistor subassemblies (include five capacitors and five transistors total) where each of the capacitor and transistor subassemblies has a corresponding bit of the five-bit control word. Each of the capacitor and transistor subassemblies may include a capacitor having the features of the capacitor 412 and a transistor having the features of the transistor 414, where the capacitors and the transistors are coupled between the node 410 and the negative rail 416. The capacitors within the capacitor and transistor subassemblies may have substantially (within 5%) the same capacitance and the transistors within the capacitor and transistor subassemblies may have substantially (within 5%) the same characteristics.

The SPO delay unit cell 400 may further include an LSB capacitor and transistor subassembly. The LSB capacitor and transistor subassembly may include one or more capacitors coupled to the node 410 between the first buffer 402 and the second buffer 404. In the illustrated embodiment, the LSB capacitor and transistor subassembly includes a capacitor 418. A capacitance of the capacitor 418 of the LSB capacitor and transistor subassembly may be less than the capacitance of the capacitors of the other capacitor and transistor subassemblies of the SPO delay unit cell 400. For example, the capacitor 412 may be a certain capacitance, which may be referred to as a unit capacitance. The capacitors of the capacitor and transistor subassemblies, other than the LSB capacitor and transistor subassembly, may have capacitances substantially (within 5%) equal to the unit capacitance. The capacitance of the capacitor 418 may be substantially (within 5%) half of the unit capacitance. A transistor 420 may be coupled between the capacitor 418 and the negative rail 416 of the SPO delay unit cell 400. A gate of the transistor 420 may receive an LSB 424. The LSB 424 may control conductance of the transistor 420. When the transistor 420 is not conducting, the capacitor 418 may be decoupled from the negative rail 416 and delay may not be applied to a signal (or a minimal delay may be applied due to non-ideal characteristics of the components of the SPO delay unit cell 400) applied at the input 406 of the SPO delay unit cell by the LSB capacitor and transistor subassembly. When the transistor 420 is conducting, the capacitor 418 may be coupled to the negative rail 416 and delay may be applied to the signal applied at the input 406 of the SPO delay unit cell 400. The amount of delay applied to the signal by the LSB capacitor and transistor subassembly may be less than the delay applied by the other capacitor and transistor subassemblies due to the capacitance of the capacitor 418 being half that of the unit capacitance.

In embodiments where a delay system (such as the delay system 200 and/or the delay system 300) includes multiple SPO delay unit cells (such as the SPO delay unit cell 400), the inclusion and/or coupling of the LSB capacitor and transistor subassembly may differ between the multiple SPO delay unit cells. For example, a transistor (such as the transistor 420) of one of the LSB capacitor and transistor subassembly within the delay system may receive the LSB 424 at the gate, whereas as the transistors of the other LSB capacitor and transistor subassemblies within the delay system may receive the negative rail 416 at the gate that causes the transistors to remain in non-conducting state (or another signal that causes the transistors to remain in the non-conducting state) in some embodiments. In these embodiments, the LSB capacitor and transistor subassemblies with the gates tied to the negative rail 416 may not apply delay (or a minimal delay may be applied due to non-ideal characteristics of the components of the SPO delay unit cell 400) to the input regardless of the control words and/or LSB applied to the SPO delay unit cell 400. In other embodiments where the delay system includes multiple SPO delay unit cells, one of the SPO delay units may include an LSB capacitor and transistor subassembly, while the other SPO delay units may have the LSB capacitor and transistor subassembly omitted. Although the LSB 424 is described as a separate signal herein, it should be understood that the LSB 424 may be included as part of the control word 422 provided to the SPO delay unit cell 400 in other embodiments, such as the LSB 424 being the LSB of the control word 422 in some embodiments.

A diagram 426 shows an example of delays that can be applied to an input signal by the SPO delay unit cell 400. An example input signal 428 (labeled IN) is shown, which may have been applied to the input 406 of the SPO delay unit cell 400. For brevity, the delays applied by the SPO delay unit cell 400 will be described in relation to a rising edge 430 of the input signal 428. It should be understood that the delays described in relation to the rising edge 430 of the input signal 428 may be applied to the other edges of the input signal 428.

An example mid signal 432 (labeled MID) is shown, where the mid signal 432 illustrates examples of signals occurring at the node 410 resulting from a delay being applied to the input signal. The mid signal 432 illustrated may be inverted from the input signal 428 due to the first buffer 402 being an inverter in the illustrated embodiment. A falling edge 434 of the mid signal 432 may correspond to the rising edge 430 of the input signal 428. The falling edge 434 may occur after the rising edge 430 due to a delay caused by the first buffer 402. As can be seen, the falling edge 434 shows multiple falling edges that can result from delay being applied to the input signal 428 by the SPO delay unit cell 400. In particular, the falling edge 434 may be steeper when less delay is applied to the input signal 428 and less steep when the greater delay is applied to the input signal 428. For example, when no delay is being applied by the capacitor and transistor subassemblies and the LSB capacitor and transistor subassembly, the falling edge 434 may be substantially (within 2 degrees) vertical. As the amount of delay being applied by the capacitor and transistor subassemblies and the LSB capacitor and transistor subassembly increases, the angle of the falling edge 434 from vertical increases.

An example out signal 436 (labeled OUT) is shown, where the out signal 436 illustrates examples of signals occurring at the output 408 resulting from a delay being applied to the input signal. The out signal 436 may be inverted from the mid signal 432 due to the second buffer 404 being an inverter in the illustrated embodiment. A rising edge 438 of the out signal 436 may correspond to the falling edge 434 of the mid signal 432. The rising edge 438 may occur after the falling edge 434 due to a delay caused by the second buffer 404. As can be seen, the rising edge 438 shows multiple rising edges that can result from delay being applied to the input signal 428 by the SPO delay unit cell 400. The delay of the rising edge 438 may be based on a time that the falling edge 434 reaches a certain value. For example, the second buffer 404, that outputs the out signal 436, may receive the mid signal 432 and may monitor the value of the mid signal 432. The second buffer 404 may output the inverted value of the mid signal 432. As the mid signal 432 is transitioning values (such as at the falling edge 434), the second buffer 404 may change the value of the out signal 436 once the mid signal 432 has reached a certain value. For example, the second buffer 404 may cause the out signal 436 to transition in response to the mid signal 432 having transitioned to a certain amount of the way to the new state. For example, the second buffer 404 may transition the out signal 436 via the rising edge 438 in response to the mid signal 432 transitioning via the falling edge 434 to the low state or a certain percentage of the way to the low state. When the falling edge is substantially vertical, the mid signal 432 will reach the low state or the certain percentage of the way to the low state without delay (or minimal delay due to non-ideal characteristics of the components of the SPO delay unit cell 400) causing the second buffer 404 without delay. As the angle of the falling edge 434 increases from vertical, the time it takes for the mid signal 432 to reach the low state or the certain percentage of the way increases, thereby increasing a delay caused by the capacitor and transistor subassembly and/or the LSB capacitor and transistor subassembly to increase. The delay applied by the capacitor and transistor subassembly and/or the LSB capacitor and transistor subassembly to the input signal 428 may be in addition to the delays applied by the first buffer 402 and the second buffer 404 to the input signal 428. Accordingly, the out signal 436 may be a result of a delay being applied to the input signal 428 by the SPO delay unit cell 400.

Figure 5:
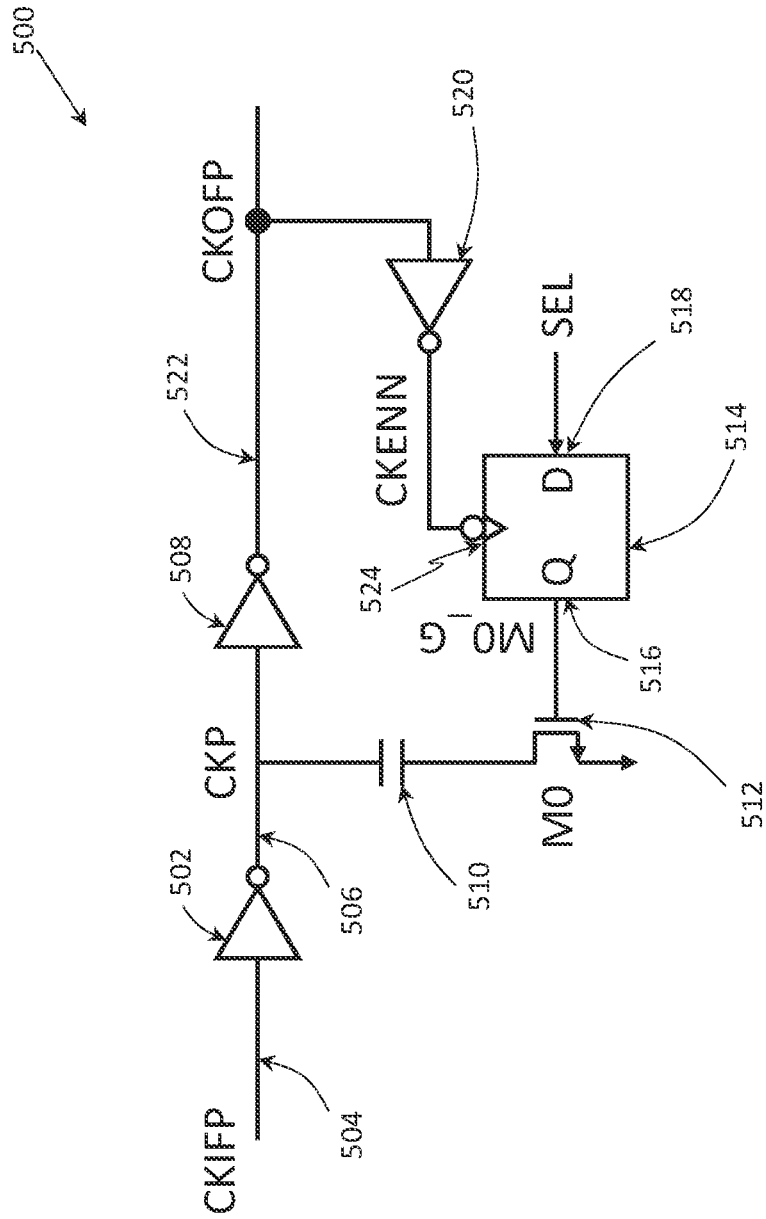
FIG. 5 illustrates an example circuit with glitch suppression, according to various embodiments of the disclosure.

FIG. 5 illustrates an example circuit 500 with glitch suppression, according to various embodiments of the disclosure. The circuit 500 may be implemented within an SPO delay element of a delay system, such as the first SPO delay element 302 (FIG. 3), the second SPO delay element 304 (FIG. 3), and/or the third SPO delay element 306 (FIG. 3) of the delay system 300 (FIG. 3). For example, the circuit 500 may provide glitch protection that may be caused by capacitor and transistor subassemblies, such as the capacitor and transistor subassemblies and/or the LSB capacitor and transistor subassembly of FIG. 4. Each of the capacitor and transistor subassemblies and/or the LSB capacitor and transistor subassembly within a delay system may include the features of the circuit 500 for glitch suppression.

The circuit 500 may include a first buffer 502. The first buffer 502 may comprise an inverter that may invert an input to the first buffer 502. The first buffer 502 may correspond to the first buffer 402 (FIG. 4) of the SPO delay unit cell 400 (FIG. 4). The first buffer 502 may receive a signal on an input 504 (labeled CKIFP) of the circuit 500. In some embodiments, the signal received on input 504 may comprise a clock signal. The first buffer 502 may output a signal on a node 506 (labeled CKP) based on the signal received on the input 504. The node 506 may correspond to the node 410 (FIG. 4).

The circuit 500 may include a second buffer 508. The second buffer 508 may comprise an inverter that may invert an input to the second buffer 508. The second buffer 508 may correspond to the second buffer 404 (FIG. 4) of the SPO delay unit cell 400 (FIG. 4). An input of the second buffer 508 may be coupled to an output of the first buffer 502, such that the node 506 is between the first buffer 502 and the second buffer 508. An output of the second buffer 508 may be coupled to an output 522 (labeled CKOFP) of the circuit 500, such a signal on the output of the second buffer 508 is an output of the circuit 500. The signal on the output of the second buffer 508 may be a delayed or compensated version of the signal on the input 504 based on the states of capacitor and transistor subassemblies of the circuit 500.

The circuit 500 may include one or more capacitor and transistor subassemblies (such as the capacitor and transistor subassemblies and/or the LSB capacitor and transistor subassembly of FIG. 4). For brevity, a single capacitor and transistor subassembly is shown in the illustrated embodiment. The capacitor and transistor subassembly may include a capacitor 510 and a transistor 512. The capacitor 510 may correspond to the capacitor 412 (FIG. 4) and the transistor 512 may correspond to the transistor 414 (FIG. 4). The operation of the capacitor and transistor subassembly, including the capacitor 510 and the transistor 512, may be to apply delay to the signal received on the input, such as described in relation to the capacitor and transistor subassemblies and the LSB capacitor and transistor subassembly of FIG. 4. For example, the capacitor and transistor subassembly may apply delay to the signal when the transistor 512 is conducting and may apply no delay (or minimal delay due to non-ideal characteristics of the circuit 500) when the transistor 512 is not conducting.

The circuit 500 may include a latch 514. The latch 514 may comprise a D flip-flop. An output 516 (labeled MO_G) of the latch 514 may be coupled to a gate of the transistor 512, where a signal on the output 516 may control conduction of the transistor 512. For example, when a signal on the output 516 is in a high state, the transistor 512 may conduct and when a signal on the output 516 is in a low state, the transistor 512 may not conduct (or conduct a minimal amount due to non-ideal characteristics of the transistor 512). The value of the signal on the output 516 may be based on a value of a signal received at an input 518 (labeled SEL) of the latch 514. For example, the value of the signal on the output 516 may be set equal to a value received on the input 518 in response to the latch 514 receiving a trigger event. The value of the input 518 of the latch 514 may be based on a control word, such as the control word provided to the SPO delay elements of the delay system 300 and/or the control word 422 (FIG. 4). For example, the value of the input 518 may be equal to a bit of the control word that corresponds to the particular capacitor and transistor subassembly.

The circuit 500 may further include a third buffer 520. The third buffer 520 may be an inverting buffer. An input of the third buffer 520 may be coupled to the output 522 of the circuit 500 and an output (labeled CKENN) of the third buffer 520 may be coupled to a trigger input 524 of the latch 514. The third buffer 520 may output a trigger event to cause the latch 514 to be triggered. In particular, the trigger event for the latch 514 may comprise an edge of a signal output by the third buffer 520, where the edge acts as a trigger for the latch 514. For example, the latch 514 may be triggered by a negative edge of the signal output by the third buffer 520 in the illustrated embodiment. In response to the latch 514 being triggered, the latch 514 may set a value of the output 516 equal to a current value of the input 518. The latch 514 may maintain the value on the output 516 in between the latch 514 being triggered.

In embodiments where there are multiple capacitor and transistor subassemblies and/or LSB capacitor and transistor subassemblies, the third buffer 520 may be shared by the capacitor and transistor subassemblies and/or LSB capacitor and transistor subassemblies. In particular, the capacitor and transistor subassemblies and/or LSB capacitor and transistor subassemblies may each include a corresponding latch (such as the latch 514) that may receive a bit for the particular capacitor and transistor subassembly or LSB for the particular LSB capacitor and transistor subassembly. The third buffer 520 may couple to or provide the same output to each of the latches of the capacitor and transistor subassemblies and/or the LSB capacitor and transistor subassemblies, where the third buffer 520 may output an edge to act as a trigger for each of the latches. For example, when an SPO delay unit cell (such as the SPO delay unit cell 400 (FIG. 4)) includes five capacitor and transistor subassemblies and an LSB capacitor and transistor subassembly, the SPO delay unit cell may include six latches (one for each capacitor and transistor subassembly and one for the LSB capacitor and transistor subassembly) and the third buffer 520 that is coupled to each of the latches. In other embodiments, the capacitor and transistor subassemblies and/or LSB capacitor and transistor subassemblies may each include a corresponding buffer (such as the third buffer 520) to trigger the corresponding latch of the capacitor and transistor subassemblies and/or LSB capacitor and transistor subassemblies.

Glitches may occur when a transition of a signal at node 506 occurs at a same time that a value on the output 516 of the latch 514 is changed, which causes the transistor 512 to transition between conducting and not conducting. The circuit 500 prevents this situation. In particular, by having the third buffer 520 receive a signal from the output 522 and the output of the third buffer 520 being utilized to trigger the latch 514, any change of a value on the output 516 of the latch will occur approximately (within 5%) an amount of delay caused by the second buffer 508 and the third buffer 520 after the transition of the signal at node 506. The signal at the node 506 may be applied to the second buffer 508 and the second buffer 508 may apply a delay when generating a signal at the output 522, the signal at the output 522 being an inverted or non-inverted version of the signal at the node 506 depending on whether the second buffer 508 is inverting or non-inverting. The signal at the output 522 may be applied to the third buffer 520 and the third buffer 520 may apply a delay when generating a signal at the trigger input 524 of the latch 514, where the signal at the trigger input 524 is an inverted or non-inverted version of the signal at the output 522 depending on whether the third buffer 520 is inverting or non-inverting. The delay caused by the second buffer 508 and the third buffer 520 may be less than a frequency of a signal applied to the input 504. For example, instances where a signal applied to the input 504 is a clock signal, the delay caused by the second buffer 508 and the third buffer 520 may be less than a period of the clock signal. Accordingly, the circuit 500 may not suffer from glitches that can occur in legacy SPO delay elements.

In embodiments having multiple capacitor and transistor subassemblies and/or LSB capacitor and transistor subassemblies with latches, the latches being fed by the buffer or buffers (such as the third buffer 520) may provide glitch suppression for each of the capacitor and transistor subassemblies and/or LSB capacitor and transistor subassemblies. Effectively, the latches ensures that the transistor 512 does not change conduction states when the clock signal at node 506 transitions states.

Figure 6:
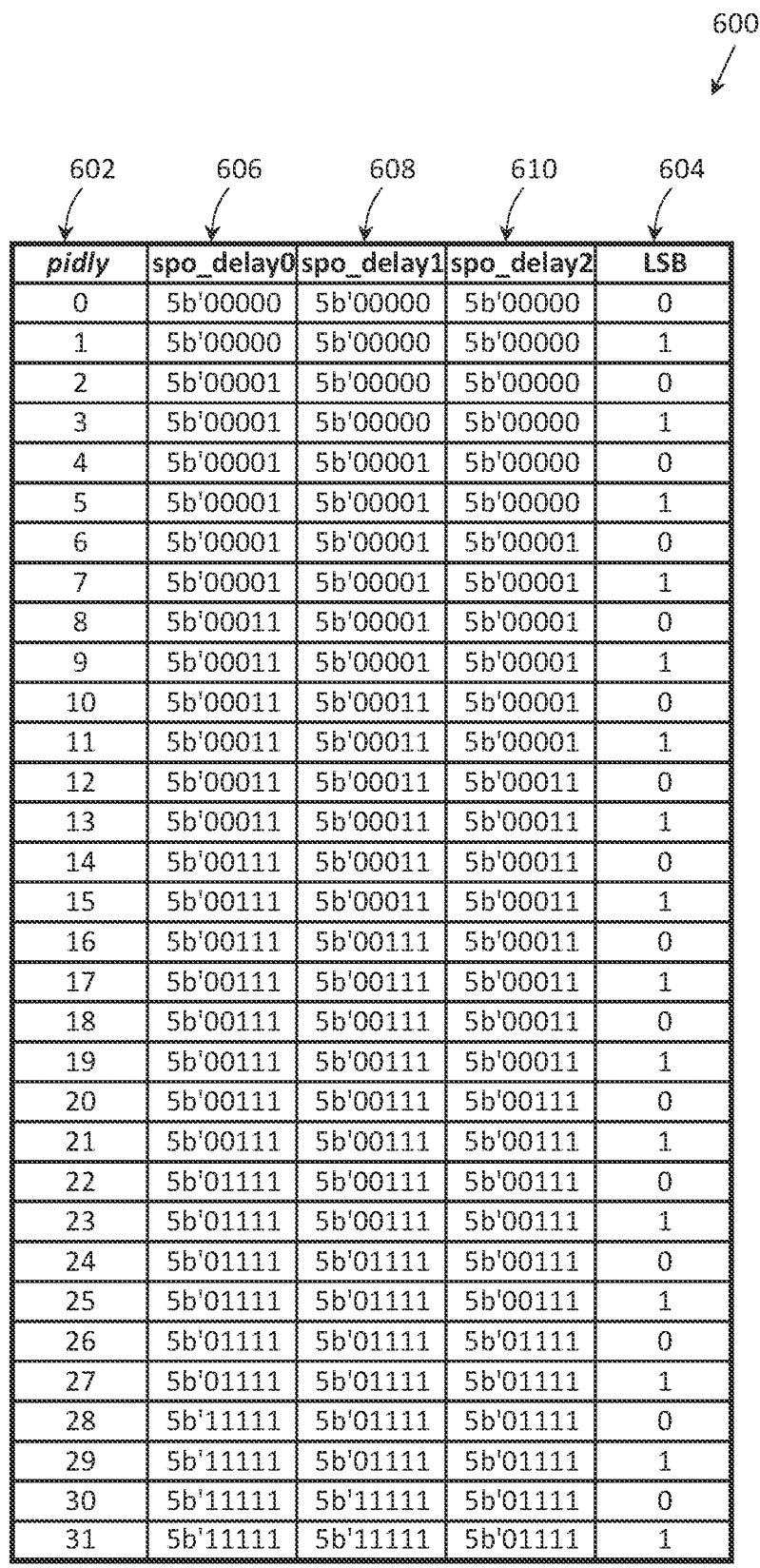
FIG. 6 illustrates an example ordered table of control words, according to various embodiments of the disclosure.

FIG. 6 illustrates an example ordered table 600 of control words, according to various embodiments of the disclosure. The control words within the table 600 may be implemented by a delay system (such as the delay system 300 (FIG. 3)). For example, the control words may be implemented by the shift register 312 (FIG. 3) of the delay system 300.

The control words to be output by the shift register to the SPO delay elements may be based on a value (referred to as pidly 602 herein) stored on the shift register. The value of pidly 602 may be updated based on the shift signal 320 (FIG. 3), the reset signal 318 (FIG. 3), and/or the strobe signal 322 (FIG. 3). For example, the value of pidly 602 may be reset to certain value (such as 0) in response to receiving an indication to reset of the reset signal 318 and, in some embodiments, a transition of the strobe signal 322. The value of pidly 602 may be increased or decreased based on a current value of pidly 602, a value of the shift signal 320, and in response to a transition of the strobe signal 322. Increasing the value of pidly 602 may correspond to increasing an amount of delay applied by the delay system to an input signal. Decreasing the value of pidly 602 may correspond to decreasing an amount of delay applied by the delay system to an input signal. Accordingly, determining that the value of pidly 602 should be increased may correspond to determining that an amount of delay applied by a delay system is to be increased, and determining that the value of pidly 602 should be decreased may correspond to determining that an amount of delay applied by the delay system is to be decreased.

As the value of pidly 602 is changed, the values of an LSB 604 and/or one of the control words (i.e., a first control word 606, a second control word 608, and a third control word 610) may be updated. In particular, as the value of pidly 602 is increased or decreased, the value of the LSB 604 may be alternated between a high state (indicated as 1 in the table 600) and a low state (indicated as 0 in the table 600). The control words may comprise thermometer-encoded control words, where the increase or decrease of the value of pidly 602 may cause the one of the control words to transition to the next thermometer-encoded control word value in the thermometer-encoded control word series. In the instance where the LSB 604 is in a low state and a value of pidly 602 is increased, or the LSB 604 is in a high state and a value of pidly 602 is decreased, the value of the LSB 604 may be alternated to the opposite state and the values of the control words may remain the same. In the instance where the LSB 604 is in a high state and a value of pidly 602 is increased, the value of LSB 604 may be alternated and a value of one of the control words may be increased by a single bit. In the instance where the LSB 604 is in a low state and a value of pidly 602 is decreased, the value of the LSB 604 may be alternated and a value of one of the control words may be decreased by a single bit. The values of the control words may be maintained within a single bit difference. When a value of pidly 602 is at a minimum value (0 in the illustrated embodiment) and it is indicated that the value of pidly 602 should be decreased (as may be indicated by value of the shift signal 320 being in a low state when the transition of the strobe signal 322 occurs), the value of pidly 602 may remain at the minimum value. Further, when a value of pidly 602 is at a maximum value (31 in the illustrated embodiment) and it is indicated that the value of pidly 602 should be increased (as may be indicated by value of the shift signal 320 being in a high state when the transition of the strobe signal 322 occurs), the value of pidly 602 may remain at the maximum value.

As can be seen from the table 600, when pidly 602 has a value of 0, the LSB 604 may be in a low state and all the bits of the control words may be in a low state. When pidly 602 increases to the value of 1, the LSB 604 may transition to a high state while all the bits of the controls may remain in a low state. When pidly 602 increases to the value of 2, the LSB 604 may transition to a low state while a first bit of the first control word 606 changes to a high state. As a value of pidly 602 increases from 3 to 4, the LSB 604 may transition to a low state while a first bit of the second control word 608 changes to a high state. By having the first bit of the second control word 608 transitioning to a high state rather than a second bit of the first control word 606, the control words may remain within a bit difference of each other. Transitioning the control words such that each control word is within a bit of each other may minimize phase noise jitter. As a value of pidly 602 transitions from 5 to 6, the first bit of the first control word 606 and the first bit of the second control word 608 are already in a high state, a first bit of the third control word 610 may be transitioned to a high state to keep the control words within a bit difference of each other. As a value of pidly 602 transitions from 7 to 8, since the first bits of each of the control words is in a high state, the second bit of the first control word 606 may transition to a high state to maintain the control words within one bit of each other.

When the shift register 312 implements the control words and the LSB 604 shown in the table 600, the shift register 312 may provide the control words and the LSB 604 to the first SPO delay element 302, the second SPO delay element 304, and the third SPO delay element 306. In particular, the shift register 312 may provide the LSB 604 to the first SPO delay element 302 as the least significant bit 324 (FIG. 3) and the first control word 606 (labeled spo_delay0) as the first control word 326 (FIG. 3). Further, the shift register 312 may provide the second control word 608 (labeled spo_delay2) to the second SPO delay element 304 as the second control word 328 (FIG. 3) and the third control word 610 (labeled spo_delay2) to the third SPO delay element 306 as the third control word 330 (FIG. 3). The control words and the LSB 604 may control an amount of delay applied by the first SPO delay element 302, the second SPO delay element 304, and the third SPO delay element 306. Further, each of the first SPO delay element 302, the second SPO delay element 304, and the third SPO delay element 306 may implement SPO delay unit cells (such as the SPO delay unit cell 400 (FIG. 4)) having the features of the circuit 500 (FIG. 5). Accordingly, as the LSB 604 and the control words are updated, the features of the circuit 500 may prevent transistors of the capacitor and transistor subassemblies (such as the capacitor and transistor subassembly and the LSB subassembly described in relation to FIG. 4) from transitioning while inputs of the SPO delay elements are transitioning, thereby preventing glitches that may occur within the delay system.

Figure 7:
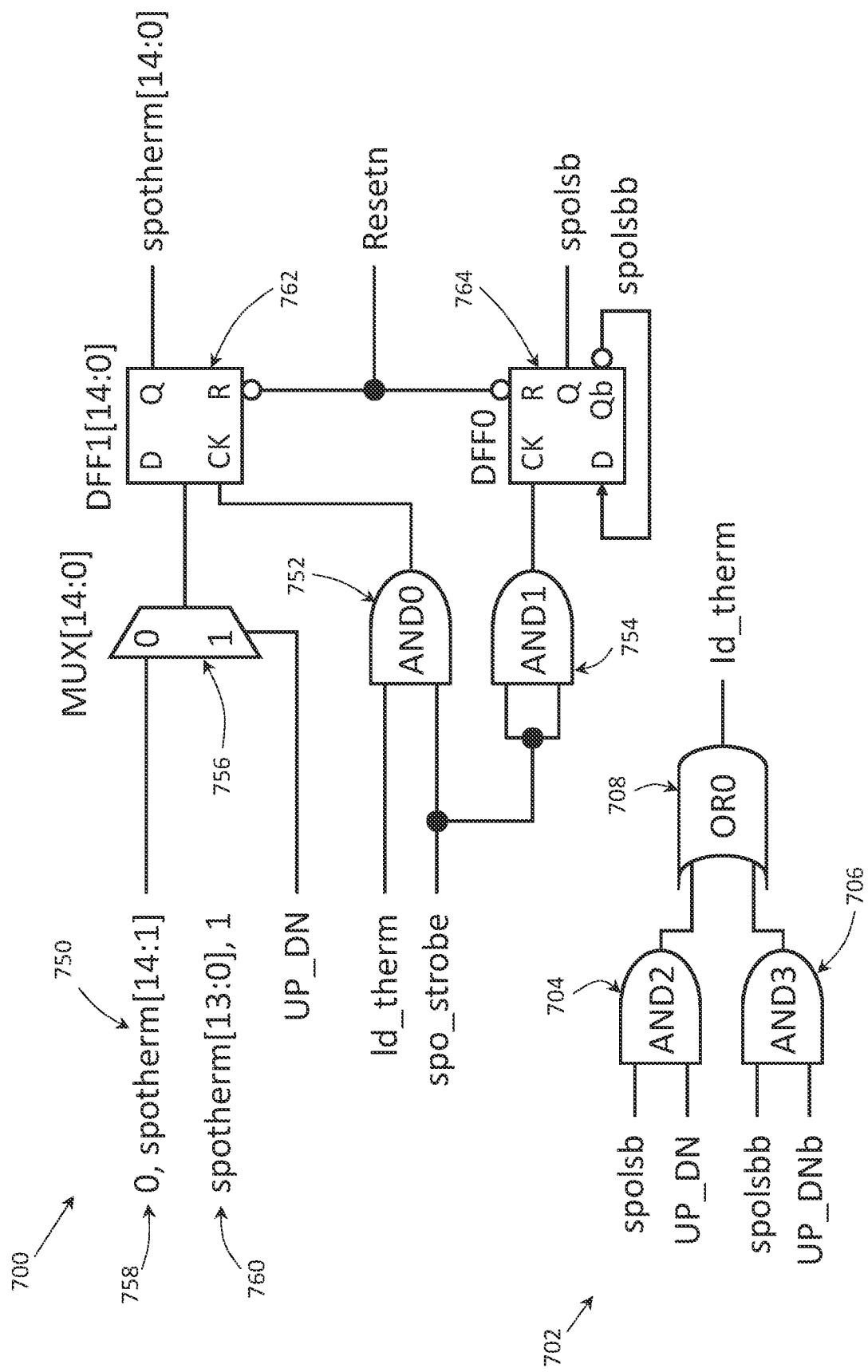
FIG. 7 illustrates example logic circuitry that may be utilized for updating control words and/or a least significant bit, according to various embodiments of the disclosure.

FIG. 7 illustrates example logic circuitry 700 that may be utilized for updating control words and/or an LSB, according to various embodiments of the disclosure. For example, the shift register 312 (FIG. 3) may implement, and/or may be coupled to circuitry that implements, the features of the logic circuitry in updating control words and/or an LSB as described herein. The circuitry 700 may implement updates of control words and/or an LSB in accordance with the update approach of the control words and the LSB 604 described in relation to the table 600.

The circuitry 700 may comprise a first circuit 702. The first circuit 702 may be utilized for determining whether a control word and an LSB should be updated based on input signals (such as the reset signal 318 (FIG. 3) and/or the shift signal 320 (FIG. 3)), or whether an LSB should be updated while the control words are maintained in a current state. For example, the first circuit 702 may determine whether a value of the LSB is in a high state and it is indicated that a value (such as pidly) for determining states of the control words and/or the LSB is to be increased. If it is determined that the value of the LSB is in the high state and it is indicated that the value is to be increased, the first circuit 702 may determine that both the control word and the LSB are to be updated. The first circuit 702 may further determine whether a value of the LSB is in a low state and it is indicated that the value for determining states of the control words and/or the LSB is to be decreased. If it is determined that the value of the LSB is in the low state and it is indicated that the value is to be decreased, the first circuit 702 may determine that both the control word and the LSB are to be updated. If the first circuit 702 determines that neither of the previous two instances are present, the first circuit 702 may determine that the LSB are to be updated and the control words are to be maintained at the current states.

The first circuit 702 may include first AND logic 704. The first AND logic 704 may receive a value of the LSB (such as LSB 324 (FIG. 3), which is labeled spolsb) and a value of a shift signal (such as the shift signal 320 (FIG. 3), which is labeled UP_DN). The first AND logic 704 may AND the value of the LSB and the value of the shift signal. ANDing the value of the LSB and the value of the shift value may equate to determining whether the LSB is in a high state and it is being indicated that the value for determining the states of the control words and/or the LSB is to be increased (as indicated by the shift signal being in a high state).

The first circuit 702 may further include second AND logic 706. The second AND logic 706 may receive a negative value of LSB (such as a negative of LSB 324, which is labeled spolsbb) and a negative value of a shift signal (such as a negative of the shift signal 320, which is labeled UP_DNb). The second AND logic 706 may AND the negative value of the LSB and the negative value of the shift signal. ANDing the negative value of the LSB and the negative value of the value of the shift signal may equate to determining whether the LSB is in a low state and it is being indicated that the value for determining the states of the control words and/or the LSB is to be decreased (as indicated by the shift signal being in a low state).

The first circuit 702 may further include OR logic 708. The OR logic 708 may receive the outputs of the first AND logic 704 and the second AND logic 706. The OR logic 708 may OR the values output by the first AND logic 704 and the second AND logic 706 to produce an output of the OR logic 708. Accordingly, if either of the first AND logic 704 and the second AND logic 706 output high states, the OR logic 708 may output a high state. If both the first AND logic 704 and the second AND logic 706 output low states, the OR logic 708 may output a low state. A high state output by the OR logic 708 may indicate that a control word should be updated, whereas a low state output by the OR logic 708 may indicate that the control words should not be updated. The output of the OR logic (labeled Id_therm) may equate to determining whether a control word should be updated based on a value of the LSB and the states of the control words.

The circuitry 700 may include a second circuit 750. The second circuit 750 may determine when a control word and an LSB is to be updated, and values to which the control word and the LSB are to be updated. The second circuit 750 may include first AND logic 752. The first AND logic may receive strobe signal (such as the strobe signal 322 (FIG. 3)) and an output of the first circuit 702. The strobe signal may indicate a time when a control word is to be updated and the output of the first circuit 702 may indicate whether the control word is to be updated. The first AND logic 752 may AND the value of the strobe signal and the output of the first circuit 702. If the strobe signal and the output of the first circuit 702 are both in a high state, the first AND logic 752 may output a high value, thereby indicating that the control word is to be updated at the time. If either of the strobe signal or the output of the first circuit 702 is in a high state, the first AND logic 752 may output a low state, indicating that the control word is not to be updated.

The second circuit 750 may further include a second circuit 750 may further include second AND logic 754. The second AND logic 754 may receive the strobe signal on both inputs of the second AND logic 754. The second AND logic 754 may AND the value of the strobe signal with the value of the strobe signal. Accordingly, the second AND logic 754 may output the value of the strobe signal. The second AND logic 754 may output a high state when the strobe signal is in a high state, which can indicate that the LSB is to be updated. The second AND logic 754 may output a low state when the strobe signal is in a low state, which can indicate that the LSB is not to be updated. The second AND logic 754 may have approximately (within 5%) the same delay as the first AND logic 752, such that the first AND logic 752 and the second AND logic 754 are to approximately output values at the same time for inputs provided to each of the first AND logic 752 and the second AND logic 754 at the same time.

The second circuit 750 may further include a multiplexer 756. The multiplexer 756 may receive two values. The first value 758 may comprise a control word that is a decrease from the current control word being output by the second circuit 750. The second value 760 may comprise a control word that is a decrease from the current control word being output by the second circuit 750. For example, the control word being output by the second circuit 750 may correspond to a value (such as pidly 602 (FIG. 6)) within an ordered table (such as the ordered table 600 (FIG. 6)). The first value 758 and the second value 760 may comprise a combination of one or more control words, such as the first control word 606 (FIG. 6), the second control word 608 (FIG. 6), and the third control word 610 (FIG. 6) to form the control word output by the second circuit 750, where the control word output by the second circuit 750 may be split into the separate control words being combined prior to being provided to the SPO delay elements, such as the first SPO delay element 302 (FIG. 3), the second SPO delay element 304 (FIG. 3), and the third SPO delay element 306 (FIG. 3). The control word that is a decrease from the current control word may be the control word corresponding to value of pidly 602 that is one less than the value of pidly 602 corresponding to the current control word. The control word that is an increase from the current control word may be the control word corresponding to the value of pidly 602 that is one greater than the value of pidly 602 corresponding to the current control word. The multiplexer 756 may further receive the value of the shift signal. The value of the shift signal may be utilized for determining whether the first value 758 or the second value 760 should be output by the multiplexer 756. The output of the multiplexer 756 may correspond to control word to which an output of the second circuit 750 is to transition after the current control word.

spo_delay0 (first control word), spo_delay1 (second control word), and spo_delay2 (third control word) can be generated from spotherm[14:0] using a modulo operation on spotherm[14:0]. The modulo operation can be represented by the following relationships:

spo_delay0[i]=spotherm[3i]
spo_delay1[i]=spotherm[3i+1]
spo_delay2[i]=spotherm[3i+2]

The second circuit 750 may further include a first latch 762. The first latch 762 may comprise a D flip-flop. The first latch 762 may receive the output of the multiplexer 756 as an input and an output of the first AND logic 752 as a clock signal. The first latch 762 may maintain a value at an output of the first latch 762. The first latch 762 may monitor for a transition of the output of the AND logic 752 as the clock signal and may update a value of the output of the first latch 762 to the value of the output of the multiplexer 756 in response to detecting the transition of the output of the AND logic 752. The first latch 762 may further receive a reset signal (such as the reset signal 318 (FIG. 3)). The first latch 762 may reset the output of the first latch 762 to a certain value in response to detecting a transition or a certain state of the reset signal. For example, the first latch 762 may reset the output to having all the bits of the control word set to a low state in response to detecting the transition or the certain state of the reset signal. The output of the first latch 762 may correspond to the control word output by the shift register 312 when the circuitry 700 is implemented in the shift register 312.

The second circuit 750 may further include a second latch 764. The second latch 764 may comprise a D flip-flop. The second latch 764 may feed a negative of the output value of the second latch 764 to an input of the second latch 764. The second latch 764 may receive an output of the second AND logic 754 as a clock signal. The second latch 764 may maintain a value at an output of the second latch 764. The second latch 764 may monitor for a transition of the output of the second AND logic 754 as the clock signal and may update a value of the output of the second latch 764 to the negative of the output value of the second latch 764 in response to detecting the transition of the output of the second AND logic 754. The second latch 764 may further receive the reset signal. The second latch 764 may reset the output of the second latch 764 to a certain value in response to detecting a transition or a certain state of the reset signal. For example, the second latch 764 may reset the output to a low state in response to detecting the transition or the certain state of the reset signal. The output of the second latch 764 may correspond to the LSB output by the shift register 312 when the circuitry 700 is implemented in the shift register 312. Accordingly, the circuitry 700 may provide the outputs of the shift register 312 when implemented by the shift register 312.

EXAMPLE IMPLEMENTATIONS

The following examples are provided by way of illustration.

Example 1 may include a delay circuit, comprising a capacitor and transistor subassembly coupled to an input of the delay circuit, a first buffer coupled between the capacitor and transistor subassembly and an output of the delay circuit, a second buffer coupled to the output of the delay circuit, and a latch coupled to the capacitor and transistor subassembly, wherein the latch is to receive an output of the second buffer as a trigger for the latch, wherein the latch is to control conduction of the capacitor and transistor subassembly, and wherein the capacitor and transistor subassembly is to apply a delay to a signal applied to the input of the delay circuit when the capacitor and transistor subassembly is conducting.

Example 2 may include the delay circuit of example 1, further comprising a third buffer coupled between the capacitor and transistor subassembly and the input of the delay circuit to couple the capacitor and transistor subassembly to the input of the delay circuit.

Example 3 may include the delay circuit of example 1, wherein the latch is to receive a bit of a control word as input to the latch, wherein the latch is to update an output of the latch with the bit in response to a trigger event from the output of the second buffer, and wherein the conduction of the capacitor and transistor subassembly is based on a value on the output of the latch.

Example 4 may include the delay circuit of example 1, wherein the capacitor and transistor subassembly comprises a capacitor and a transistor coupled between the input of the delay circuit and a negative rail of the delay circuit.

Example 5 may include the delay circuit of example 4, wherein an output of the latch is coupled to a gate of the transistor, and wherein a value on the output of the latch is control conduction of the transistor.

Example 6 may include the delay circuit of example 4, wherein the capacitor is a first capacitor, wherein the transistor is a first transistor, wherein the delay circuit further comprises a least significant bit (LSB) capacitor and transistor subassembly coupled to the input of the delay circuit, the LSB capacitor and transistor subassembly comprising a second capacitor and a second transistor, wherein a capacitance of the second capacitor is half of a capacitance of the first capacitor.

Example 7 may include the delay circuit of example 6, wherein the latch is a first latch, wherein the delay circuit further comprises a second latch coupled to the LSB capacitor and transistor subassembly, wherein the second latch is to receive an LSB as an input of the second latch, wherein the second latch is to update an output of the second latch with the LSB in response to a trigger event, and wherein the output of the second latch is to control conduction of the LSB capacitor and transistor subassembly.

Example 8 may include a delay system, comprising a static phase offset (SPO) delay element to receive an input signal, the SPO delay element comprising a capacitor and transistor subassembly coupled an input of the SPO delay element, the capacitor and transistor subassembly to apply a delay to the input signal when the capacitor and transistor subassembly is conducting, a buffer coupled to an output of the SPO delay element, and a latch coupled to the buffer and to receive an output of the buffer as a trigger input, wherein an output of the latch is to control conduction of the capacitor and transistor subassembly, and a shift register coupled to the SPO delay element, the shift register to provide a control word to the SPO delay element, wherein the control word defines a value of the output of the latch.

Example 9 may include the delay system of example 8, wherein the buffer is a first buffer, wherein the SPO delay element further comprises a second buffer coupled between the input of the SPO delay element and the capacitor and transistor subassembly and a third buffer coupled between the capacitor and transistor subassembly and the output of the SPO delay element, and wherein the second buffer is to couple the capacitor and transistor subassembly to the input of the SPO delay element.

Example 10 may include the delay system of example 8, wherein the SPO delay element is a first SPO delay element, wherein the control word is a first control word, wherein the first control word is to define an amount of delay applied to the input signal by the first SPO delay element, wherein the delay system further comprises a second SPO delay element, wherein an input of the second SPO delay element is coupled to the output of the first SPO delay element, wherein the shift register is to provide a second control word to the second SPO delay element, and wherein the second control word is to define an amount of delay applied to the input signal by the second SPO delay element.

Example 11 may include the delay system of example 10, wherein the second control word is to be within a single bit difference of the first control word.

Example 12 may include the delay system of example 10, wherein the shift register is to provide a least significant bit (LSB) to the first SPO delay element.

Example 13 may include the delay system of example 12, wherein the delay is a first delay, wherein first SPO delay element further comprises an LSB capacitor and transistor subassembly coupled to the input of the first SPO delay element, the LSB capacitor and transistor subassembly to apply a second delay to the input signal when the LSB capacitor and transistor subassembly is conducting, and wherein the LSB is to control the conductance of the LSB capacitor and transistor subassembly.

Example 14 may include the delay system of example 13, wherein the LSB capacitor and transistor subassembly is a first LSB capacitor and transistor subassembly, wherein the second SPO delay element comprises a second LSB capacitor and transistor subassembly, wherein a transistor of the first LSB capacitor and transistor subassembly is to receive the LSB to control conduction of the first LSB capacitor and transistor subassembly, and wherein a transistor of the second LSB capacitor and transistor subassembly is coupled to a negative rail of the second SPO delay element to control conduction of the second LSB capacitor and transistor subassembly.

Example 15 may include the delay system of example 8, wherein the shift register is to receive a strobe signal and a shift signal, and wherein the shift register is to update the control word based on the strobe signal and the shift signal.

Example 16 may include the delay system of example 15, wherein the shift register is to provide a plurality of control words to a plurality of SPO delay elements, the plurality of control words including the control word, wherein to update the control word is to update a single bit of the control word, and wherein the updated control word is within a single bit difference of all other control words within the plurality of control words.

Example 17 may include the delay system of example 8, wherein the control word is a thermometer-encoded control word.

Example 18 may include a method for controlling a delay system for a signal, comprising providing a first control word to a first static phase offset (SPO) delay element, providing a second control word to a second SPO delay element, wherein the second control word is within a single bit difference of the first control word, and updating a value of the first control word based on a strobe signal and a shift signal, wherein updating of the value of the first control word is maintain the second control word within the single bit difference of the first control word.

Example 19 may include the method of example 18, further comprising providing a least significant bit (LSB) to the first SPO delay element, updating the value of the LSB based on the strobe signal and the shift signal, wherein updating the value of the first control word includes determining the value of the LSB prior to updating, and determining based on the value of the LSB prior to updating and the shift signal that the value of the first control word is to be updated.

Example 20 may include the method of example 19, wherein determining based on the value of the LSB prior to updating and the shift signal that the value of the first control word is to be updated comprises determining that the value of the LSB prior to updating is in a high state and an amount of delay to be applied by the delay system is to be increased, or determining that the value of the LSB prior to updating is in a low state and the amount of delay to be applied by the delay system is to be decreased.

Example 21 may include the method of example 18, wherein providing the first control word to the first SPO delay element includes providing each bit of the first control word to corresponding latches of the first SPO delay element, wherein outputs of the corresponding latches of the first SPO delay element are to control conduction of corresponding capacitor and transistor subassemblies of the first SPO delay element, wherein the outputs of the corresponding latches are to be updated based on the first control word in response to a trigger event, and wherein trigger event is to arrive at the corresponding latches of the first SPO delay element a first amount of delay after the trigger event arrives at the corresponding capacitor and transistor subassemblies of the first SPO delay element, the first amount of delay applied by one or more buffers of the first SPO delay element, and providing the second control word to the second SPO delay element includes providing each bit of the second control word to corresponding latches of the second SPO delay element, wherein outputs of the corresponding latches of the second SPO delay element are to control conduction of corresponding capacitor and transistor subassemblies of the second SPO delay element, wherein the outputs of the corresponding latches are to be updated based on the second control word in response to the trigger event, and wherein the trigger event is to arrive at the corresponding latches of the second SPO delay element a second amount of delay after the trigger event arrives at the corresponding capacitor and transistor subassemblies of the second SPO delay element, the second amount of delay applied by one or more buffers of the second SPO delay element.

Example 22 may include a shift register of a delay system comprising a first circuit to determine, based on a least significant bit (LSB) and a shift signal, whether to update a value of the control word, and a second circuit to update a value of the LSB.

Example 23 may include the shift register of example 22, wherein the second circuit is further to update the value of the control word based on a determination, by the first circuit, that the value of the control word is to be updated.

Example 24 may include the shift register of example 22, wherein the first circuit includes first AND logic to AND the value of the LSB with the value of the shift signal, second AND logic to AND a negative of the value of the LSB with a negative of the value of the shift signal, and OR logic to OR an output of the first AND logic with an output of the second AND logic.

Example 25 may include the shift register of example 22, wherein the second circuit includes first AND logic to AND an output of the first circuit with a value of a strobe signal, second AND logic to AND the value of the strobe signal with the value of the strobe signal, a multiplexer to select between a first control word and a second control word based on a value of the shift signal, a first latch to update the value of the control word to a value of the first control word or a value of the second control word output by the multiplexer in response to a trigger event from the first AND logic, and a second latch to update the value of the LSB in response to a trigger event from the second AND logic.

Example 26 may include the shift register of example 25, wherein a reset signal is to be provided to the first latch and the second latch, wherein the first latch is to reset the value of the control word to a particular control word value in response to a trigger event of the reset signal, and wherein the second latch is to reset the value of the LSB to a particular LSB value in response to the trigger event of the reset signal.

Example 27 may include the shift register of example 18, wherein the first control word is a first thermometer-encoded control word, and wherein the second control word is a second thermometer-encoded control word.

The present disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

What is claimed is:

1. A delay system, comprising:
    a static phase offset (SPO) delay element to receive an input signal, the SPO delay element comprising:
    a capacitor and transistor subassembly coupled an input of the SPO delay element, the capacitor and transistor subassembly to apply a delay to the input signal when the capacitor and transistor subassembly is conducting;
    a buffer coupled to an output of the SPO delay element; and
    a latch coupled to the buffer and to receive an output of the buffer as a trigger input, wherein an output of the latch is to control conduction of the capacitor and transistor subassembly; and
    a shift register coupled to the SPO delay element, the shift register to provide a control word to the SPO delay element, wherein the control word defines a value of the output of the latch.

2. The delay system of claim 1, wherein the buffer is a first buffer, wherein the SPO delay element further comprises a second buffer coupled between the input of the SPO delay element and the capacitor and transistor subassembly and a third buffer coupled between the capacitor and transistor subassembly and the output of the SPO delay element, and wherein the second buffer is to couple the capacitor and transistor subassembly to the input of the SPO delay element.

3. The delay system of claim 1, wherein the SPO delay element is a first SPO delay element, wherein the control word is a first control word, wherein the first control word is to define an amount of delay applied to the input signal by the first SPO delay element, wherein the delay system further comprises a second SPO delay element, wherein an input of the second SPO delay element is coupled to the output of the first SPO delay element, wherein the shift register is to provide a second control word to the second SPO delay element, and wherein the second control word is to define an amount of delay applied to the input signal by the second SPO delay element.

4. The delay system of claim 3, wherein the second control word is to be within a single bit difference of the first control word.

5. The delay system of claim 3, wherein the shift register is to provide a least significant bit (LSB) to the first SPO delay element.

6. The delay system of claim 5, wherein the delay is a first delay, wherein first SPO delay element further comprises an LSB capacitor and transistor subassembly coupled to the input of the first SPO delay element, the LSB capacitor and transistor subassembly to apply a second delay to the input signal when the LSB capacitor and transistor subassembly is conducting, and wherein the LSB is to control the conductance of the LSB capacitor and transistor subassembly.

7. The delay system of claim 6, wherein the LSB capacitor and transistor subassembly is a first LSB capacitor and transistor subassembly, wherein the second SPO delay element comprises a second LSB capacitor and transistor subassembly, wherein a transistor of the first LSB capacitor and transistor subassembly is to receive the LSB to control conduction of the first LSB capacitor and transistor subassembly, and wherein a transistor of the second LSB capacitor and transistor subassembly is coupled to a negative rail of the second SPO delay element to control conduction of the second LSB capacitor and transistor subassembly.

8. The delay system of claim 1, wherein the shift register is to receive a strobe signal and a shift signal, and wherein the shift register is to update the control word based on the strobe signal and the shift signal.

9. The delay system of claim 8, wherein the shift register is to provide a plurality of control words to a plurality of SPO delay elements, the plurality of control words including the control word, wherein to update the control word is to update a single bit of the control word, and wherein the updated control word is within a single bit difference of all other control words within the plurality of control words.

* * * * *